(12) United States Patent
Taira et al.

(10) Patent No.: US 10,115,846 B2
(45) Date of Patent: Oct. 30, 2018

(54) SOLAR CELL AND SOLAR CELL MANUFACTURING METHOD

(71) Applicant: Panasonic Intellectual Property Management Co., Ltd., Osaka (JP)

(72) Inventors: Shigeharu Taira, Osaka (JP); Naohiro Hitachi, Osaka (JP); Satoshi Tohoda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/185,289

(22) Filed: Jun. 17, 2016

(65) Prior Publication Data

US 2016/0308076 A1 Oct. 20, 2016

Related U.S. Application Data

(63) Continuation of application No. PCT/JP2014/006038, filed on Dec. 3, 2014.

(30) Foreign Application Priority Data

Feb. 6, 2014 (JP) .................. 2014-021325

(51) Int. Cl.
*H01L 31/0232* (2014.01)
*H01L 31/0216* (2014.01)
(Continued)

(52) U.S. Cl.
CPC .... *H01L 31/02327* (2013.01); *H01L 31/0201* (2013.01); *H01L 31/02168* (2013.01);
(Continued)

(58) Field of Classification Search
CPC .................. H01L 31/02168; H01L 31/02327
See application file for complete search history.

(56) References Cited

U.S. PATENT DOCUMENTS

| 4,062,698 A | 12/1977 | Blakeslee et al. |
| 2005/0016580 A1* | 1/2005 | Haga .................. H01L 31/048 136/244 |

(Continued)

FOREIGN PATENT DOCUMENTS

| JP | 2005-019901 A | 1/2005 | |
| WO | WO-2012026806 A1 * | 3/2012 | ....... H01L 31/02161 |

(Continued)

OTHER PUBLICATIONS

International Search Report issued in International Application No. PCT/JP2014/006038, dated Jan. 20, 2015.

*Primary Examiner* — Liesl C Baumann

(74) *Attorney, Agent, or Firm* — McDermott Will & Emery LLP

(57) ABSTRACT

In a method for manufacturing a solar cell, a photoelectric conversion element, which has a surface whose outer periphery is surrounded by a plurality of sides, and a coating having light diffusivity are prepared. The coating is applied to an outer peripheral area of the surface by screen printing in a direction from a lower side, which is one of the sides, toward an upper side, which is one of the sides and which is opposed to the lower side such that an application amount of the coating to be applied along the lower side is smaller than an application amount of the coating to be applied along the upper side.

17 Claims, 10 Drawing Sheets

(51) Int. Cl.
*H01L 31/0747* (2012.01)
*H01L 31/054* (2014.01)
*H01L 31/02* (2006.01)
*H01L 31/0224* (2006.01)
*H01L 31/18* (2006.01)

(52) U.S. Cl.
CPC ........ H01L 31/022433 (2013.01); H01L 31/022466 (2013.01); H01L 31/0543 (2014.12); H01L 31/0747 (2013.01); H01L 31/18 (2013.01); *Y02E 10/52* (2013.01)

(56) References Cited

U.S. PATENT DOCUMENTS

| | | | | |
|---|---|---|---|---|
| 2006/0273421 A1* | 12/2006 | Yasuoka | H01L 31/0232 | 257/438 |
| 2009/0107547 A1* | 4/2009 | Nakashima | H01L 31/02168 | 136/256 |
| 2009/0277502 A1* | 11/2009 | Yoshida | H01L 31/02168 | 136/256 |
| 2010/0018564 A1* | 1/2010 | Shinohara | H01L 31/048 | 136/244 |
| 2010/0147363 A1* | 6/2010 | Huang | B32B 17/10009 | 136/251 |
| 2010/0218800 A1* | 9/2010 | Cousins | H01L 31/02168 | 136/244 |
| 2010/0258177 A1* | 10/2010 | Ko | H01L 31/02168 | 136/256 |
| 2010/0258178 A1* | 10/2010 | Jang | H01L 31/02168 | 136/256 |
| 2011/0272020 A1* | 11/2011 | Biro | H01L 31/02245 | 136/256 |
| 2011/0277817 A1* | 11/2011 | Ide | H01L 31/022441 | 136/246 |
| 2012/0125397 A1* | 5/2012 | Okada | H01L 31/022425 | 136/244 |
| 2013/0037085 A1 | 2/2013 | Werner et al. | | |
| 2013/0118571 A1* | 5/2013 | Shim | H01L 31/02363 | 136/256 |
| 2013/0247963 A1* | 9/2013 | Ishiguro | H01L 31/048 | 136/251 |

FOREIGN PATENT DOCUMENTS

| | | | | |
|---|---|---|---|---|
| WO | WO-2012073751 A1 * | 6/2012 | | H01L 31/048 |
| WO | 2014/132312 A1 | 9/2014 | | |

* cited by examiner

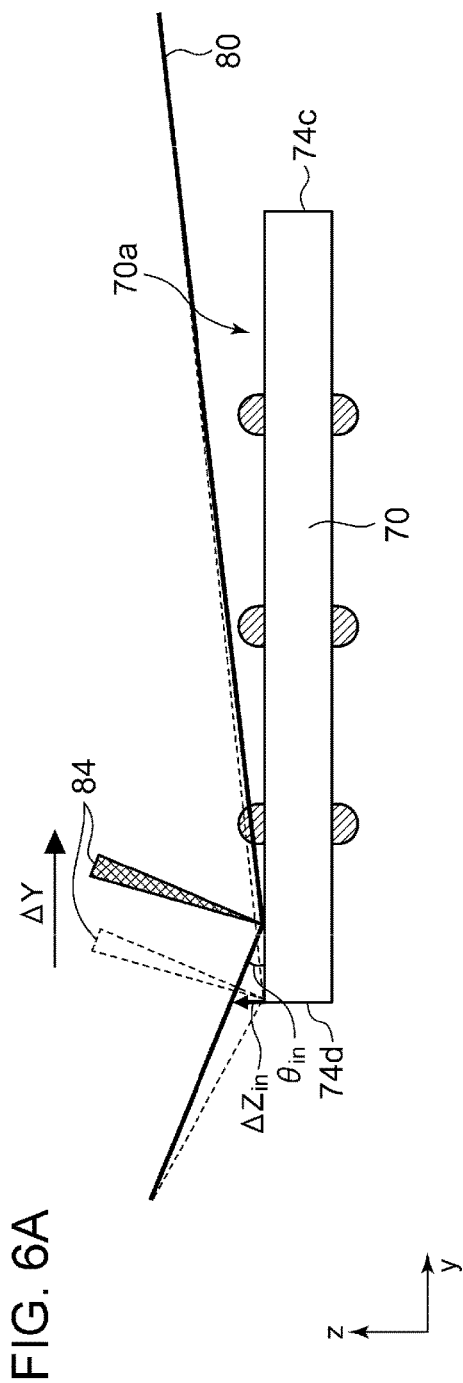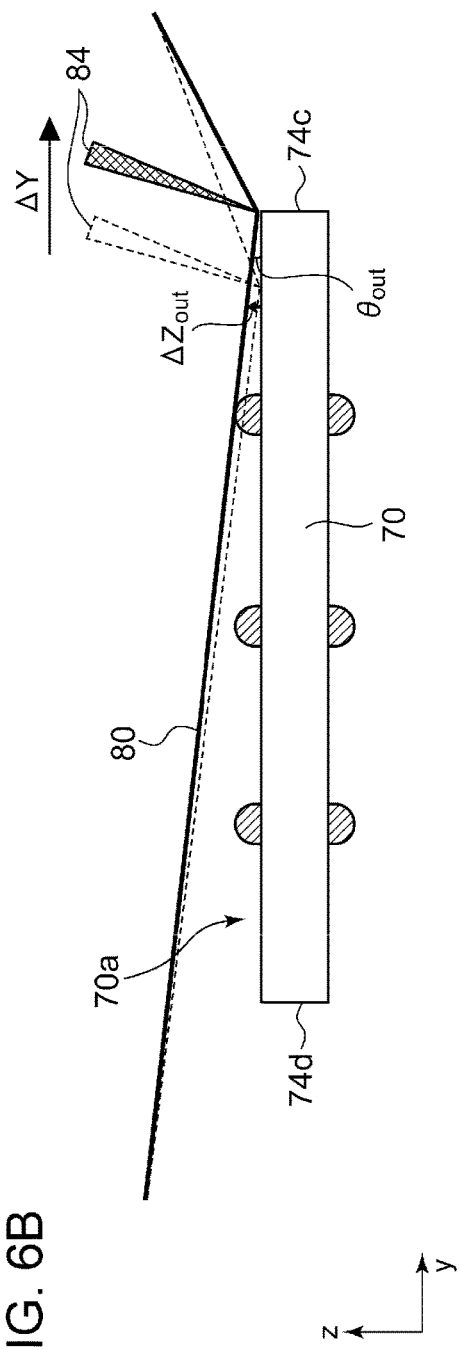

US 10,115,846 B2

SOLAR CELL AND SOLAR CELL MANUFACTURING METHOD

CROSS REFERENCE TO RELATED APPLICATIONS

This application is a Continuation Patent Application of International Application No. PCT/JP2014/006038, filed on Dec. 3, 2014, which claims priority to Japanese Patent Application No. 2014-021325, filed on Feb. 6, 2014, the entire contents of which are incorporated herein by reference.

BACKGROUND

1. Field of the Invention

The present invention relates to solar cells and solar cell manufacturing methods.

2. Description of the Related Art

A light-receiving surface of a solar cell, which is a light-incident surface, can be provided with an invalid area (an area where the generating capacity is low) that is unlikely to contribute to electricity generation even when light is incident on an area located in its outer periphery, due to manufacturing processes. In the solar cell in which such an invalid area is provided, a structure has been proposed where a light diffusion portion is provided in the invalid area for effectively utilizing the incident light by diffusing the light incident on the invalid area.

In recent years, a desire to further enhance the electricity generation efficiency of a solar cell in a solar cell module has been mentioned.

SUMMARY

The present invention has been made in view of such circumstances, and an object thereof is to provide a technique for improving the electricity generation efficiency of a solar cell in a solar cell module.

In order to solve the above problems, one aspect of the present invention is a method for manufacturing a solar cell. The method includes: preparing a photoelectric conversion element having a surface whose outer periphery is surrounded by a plurality of sides and a coating having light diffusivity; applying the coating to the outer peripheral area of the surface by screen printing in a direction from a lower side which is one of the plurality of sides to an upper side which is one of the plurality of sides and is opposed to the lower side such that the amount of the coating to be applied along the lower side is smaller than the amount of the coating to be applied along the upper side.

Another aspect of the present invention is a solar cell. The solar cell includes a photoelectric conversion element having a surface whose outer periphery is surrounded by a plurality of sides, a side surface provided between the surface and a back surface opposed to the surface, and a light diffusion portion provided in the outer peripheral area of the surface and the side surface. The light diffusion portion has a lower side light diffusion portion provided along a lower side which is one of the plurality of sides and an upper side light diffusion portion provided along the upper side which is one of the plurality of sides and is opposed to the lower side, and the width of the lower side light diffusion portion on the side surface in the direction from the surface to the back surface is smaller than the width of the upper side light diffusion portion on the side surface in the direction from the surface to the back surface.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 6A is a diagram illustrating a state of a print start position of the screen printing process, and FIG. 6B is a diagram illustrating a state of a print end position of the screen printing process;

DETAILED DESCRIPTION

Figure 1:
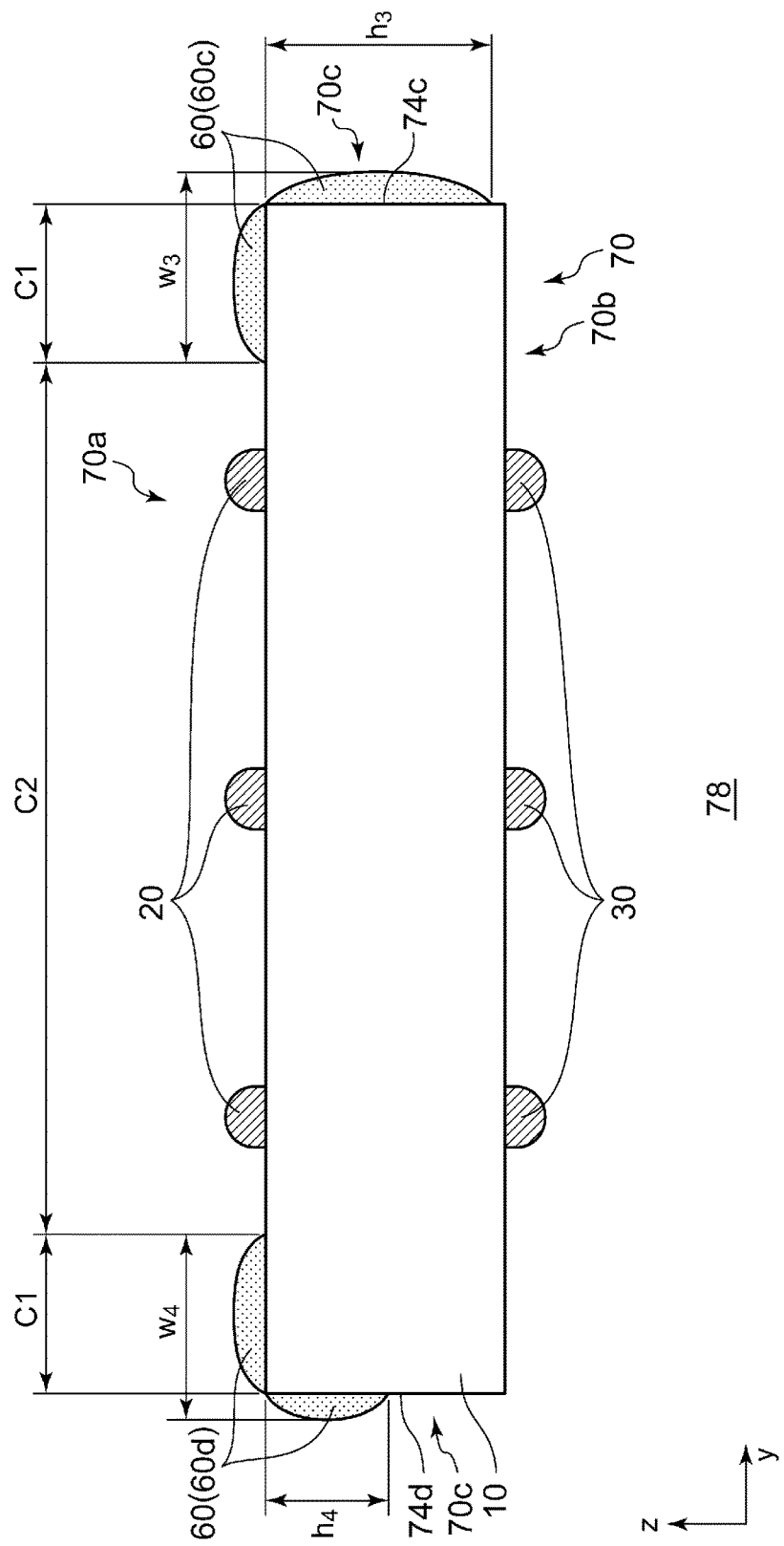
FIG. 1 is a cross-sectional view illustrating a structure of a solar cell according to an embodiment.

The invention will now be described by reference to the preferred embodiments. This does not intend to limit the scope of the present invention, but to exemplify the invention.

Hereinafter, with reference to the accompanying drawings, detailed embodiments of the present invention will be described. Incidentally, the same reference numerals are given to the same elements in the description of the drawings to appropriately omit redundant description.

Before describing the present invention in detail, the outline will be described. An embodiment of the present invention is a solar cell in which a light diffusion portion is provided in an outer peripheral area of a surface of a photoelectric conversion element. The outer peripheral area in which the light diffusion portion is provided has low collection efficiency of carriers due to its position near the end of the electrode for collecting the carriers or away from the end of the electrode and hardly contributes to electricity generation even when light is incident. This is because even when carriers are generated after the light is incident on the outer peripheral area, there is a high possibility that the carriers would recombine before reaching an electricity collection electrode. In the present embodiment, by means of providing the light diffusion portion in the outer peripheral area, the electricity generation efficiency is enhanced by absorbing, in the inner area, light that would otherwise be absorbed in the outer peripheral area.

Further, in the present embodiment, a coating is applied to the outer peripheral area of the photoelectric conversion element by screen printing to form the light diffusion portion. When the coating is applied for printing the outer peripheral area in a frame shape, it may be difficult to apply the coating with the same width between the start position and the end position of the printing. The reason is considered that the coating tends to adhere to the surface well at the start position of printing, and on the contrary, the coating does not tend to adhere well to the surface at the end position. In the present embodiment, while the application amount of the coating is reduced at the start position of the printing, the application amount of the coating is increased at the end position of the printing. This prevents the occurrence of application defects in the printing process and improves the manufacturing yield of the solar cell.

(First Embodiment)

FIG. 1 is a cross-sectional view illustrating a structure of the solar cell 78 according to an embodiment.

The solar cell 78 includes the photoelectric conversion element 70 and the light diffusion portion 60. The photoelectric conversion element 70 includes an electricity generation layer 10, a first metal electrode 20, and a second metal electrode 30.

The electricity generation layer 10 includes a light-receiving surface 70a which is one of the surfaces of the photoelectric conversion element 70, and a back surface 70b which is one of the surfaces of the photoelectric conversion element 70 and is arranged back to back with the light-receiving surface 70a. Here, the light-receiving surface refers to a main surface of the photoelectric conversion element 70 on which sunlight is incident, and in particular, is a surface that most of the light incident on the electricity generation layer 10 enters.

The electricity generation layer 10 is a layer for generating photovoltaic power by absorbing the incident light and has, for example, a substrate made of a semiconductor material such as crystalline silicon, gallium arsenide (GaAs) or indium phosphide (InP). The structure of the electricity generation layer 10 is not particularly limited but, in the present embodiment, has a heterojunction of an n-type single-crystal silicon substrate and an amorphous silicon. The electricity generation layer 10 is formed such that, for example, an i-type amorphous silicon layer, a p-type amorphous silicon layer in which boron (B) or the like is doped and a transparent conductive layer made of a transparent conductive oxide such as indium oxide are stacked in this order on the first main surface on the light-receiving surface 70a side of the n-type single-crystal silicon substrate. Further, an i-type amorphous silicon layer, an n-type amorphous silicon layer in which phosphorus (P) or the like is doped and a transparent conductive layer are stacked in this order on the second main surface on the back surface 70b side of the single-crystal silicon substrate.

In the present embodiment, an i-type amorphous layer, a p-type amorphous layer, and a transparent conductive layer provided on the first main surface of the semiconductor substrate that constitutes the electricity generation layer 10 are formed on the first main surface so as to cover substantially the entire surface of the first main surface including the outer peripheral area C1 and the inner area C2. Similarly, an i-type amorphous layer, an n-type amorphous layer, and a transparent conductive layer provided on the second main surface of the semiconductor substrate that constitutes the electricity generation layer 10 are formed on the second main surface so as to cover substantially the entire surface of the second main surface including the outer peripheral area C1 and the inner area C2. In other words, an amorphous semiconductor layer having one conductivity type corresponding to the p-type or the n-type is formed on the first main surface or the second main surface of the semiconductor substrate so as to cover substantially the entire surface of the main surface including the outer peripheral area C1.

The first metal electrode 20 and the second metal electrode 30 are electrodes for taking out the electric power generated by the electricity generation layer 10 to the outside. The first metal electrode 20 is provided on the light-receiving surface 70a of the photoelectric conversion element 70, and the second metal electrode 30 is provided on the back surface 70b opposed to the light-receiving surface 70a. The first metal electrode 20 and the second metal electrode 30 are formed of conductive materials including copper (Cu) or aluminum (Al) for example. Incidentally, these electrodes may include an electrolytic plating layer of copper (Cu), tin (Sn) or the like. However, being not limited to this, these electrodes may include other metals such as gold and silver, other conductive materials or a combination thereof.

The light diffusion portion 60 is formed of a material having light diffusivity with respect to light having a wavelength to be absorbed by the photoelectric conversion element 70. Here, having light diffusivity refers to having a property of reflecting light incident on the light diffusion portion 60 mainly by diffuse reflection rather than mirror reflection. The light diffusion portion 60 is formed of a material having an electrical insulation property. For the light diffusion portion 60 having such properties, an insulating white material in which particles of titania ($TiO_2$) or alumina ($Al_2O_3$) or the like are dispersed in a resin substrate such as an epoxy resin or an acrylic resin is used for example. Accordingly, the light diffusion portion 60 has low conductivity and high light diffusivity as compared with the first metal electrode 20. The light diffusion portion 60 needs a thickness that can sufficiently scatter the incident light. The thickness maybe between 3 μm and 100 μm inclusive, and for example, it may be about 20 μm to 30 μm.

The light diffusion portion 60 directs light toward the inner area C2 of the light-receiving surface 70a by scattering the light entering toward the outer peripheral area C1. The light scattered by having been incident on the light diffusion portion 60 is totally reflected at a boundary surface between the encapsulant and the outside air when the solar cell 78 has been sealed, and enters the inner area C2. Since the outer peripheral area C1 is at a position near or away from the end portion of the first metal electrode 20 that collects carriers and thus has low collection efficiency of carriers as compared with the inner area C2, it is unlikely to contribute to electricity generation even when light enters. By providing the light diffusion portion 60 in the outer peripheral area C1 like this, light that would otherwise be absorbed in the outer peripheral area C1 is made to be absorbed in the inner area C2.

The light diffusion portion 60 is formed to cover at least a part of a side surface 70c so as to scatter the incident light heading toward the side surface 70c of the photoelectric conversion element 70. By providing the light diffusion portion 60 on both the light-receiving surface 70a and the side surface 70c, light incident on the light diffusion portion 60 can be scattered effectively. The light diffusion portion 60 is formed so as to avoid the corner 70d formed of the light-receiving surface 70a and the side surface 70c. By forming the light diffusion portion 60 avoiding the corner 70d, the amount of a resin material required for formation of the light diffusion portion 60 can be reduced as compared with the case of providing the light diffusion portion 60 to cover the corner 70d. Further, when the light diffusion portion 60 is formed avoiding the corner 70d, since the corner 70d is exposed even after the light diffusion portion 60 is formed, the outer periphery of the photoelectric conversion element 70 can be visually recognized easily. Therefore, when performing alignment using techniques of image recognition or the like, the pattern recognition is easy.

An upper side light diffusion portion 60c provided on an upper side 74c of the photoelectric conversion element 70 has a different range of the light diffusion portion 60 covering the side surfaces 70c from that of a lower side light diffusion portion 60d provided on a lower side 74d of the photoelectric conversion element 70. Incidentally, the positional relationship of the upper side 74c and the lower side 74d will be described later with reference to FIG. 2. The upper side light diffusion portion 60c has a width $h_3$ which covers substantially the entire side surface 70c in the direction (z-direction) from the light-receiving surface 70a toward the back surface 70b. On the other hand, the lower side light diffusion portion 60d has a width $h_4$ which covers apart of the side surface 70c on the light-receiving surface 70a side, and for example, it covers a substantially half area of the side surface 70c. Therefore, the light diffusion portion 60 is formed such that the width $h_4$ on the side surface 70c corresponding to the lower side 74d is smaller than the width $h_3$ on the side surface 70c corresponding to the upper side 74c.

Figure 2:
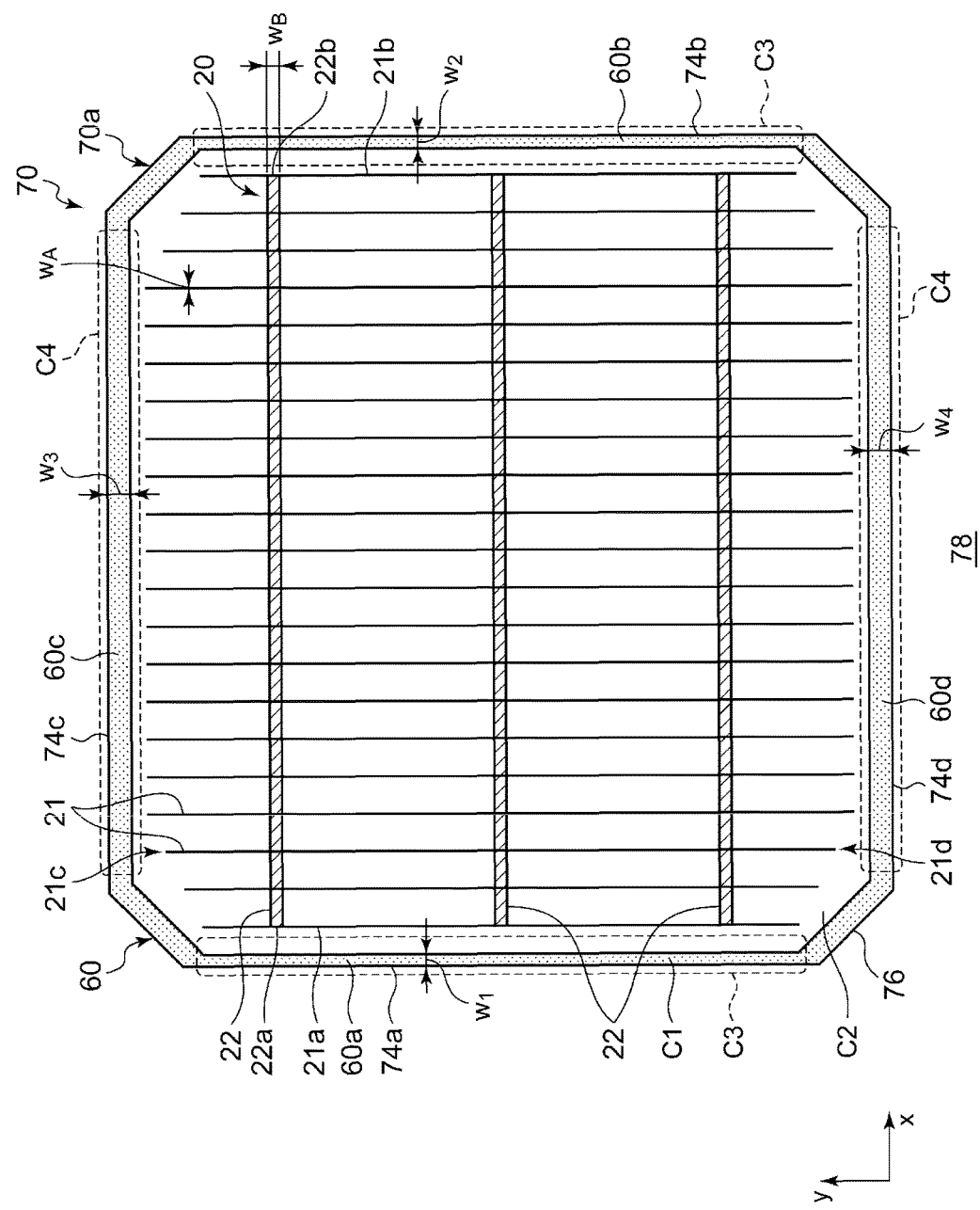
FIG. 2 is an external view illustrating a solar cell according to an embodiment.

FIG. 2 is an external view illustrating the light-receiving surface 70a of the solar cell 78 according to an embodiment.

The light-receiving surface 70a has an octagonal shape having four sides 74a to 74d, and corner portions 76 with the corners cut off at four positions. Hereinafter, for convenience of the description, each of the four sides 74a to 74d are also referred to as a left side 74a, a right side 74b, an upper side 74c and a lower side 74d. Here, the left side 74a and the right side 74b are sides extending in parallel to finger electrodes 21 and are sides extending in the direction (y-direction) perpendicular to bus bar electrodes 22. Further, the upper side 74c and the lower side 74d are sides extending in parallel to the bus bar electrodes 22 and are sides extending in the direction (x-direction) perpendicular to the finger electrodes 21.

Further, an area along the left side 74a or the right side 74b in the outer peripheral area C1, in other words, an area close to left ends 22a or right ends 22b of the bus bar electrodes 22 is also referred to as a bus bar end area C3. On the other hand, the area along the upper side 74c or the right side 74b, in other words, an area close to upper ends 21c or lower ends 21d of the finger electrodes 21 is also referred to as a finger end area C4. Since the bus bar end area C3 is close to the bus bar electrodes 22, and also, the left or the right end finger electrode 21a or 21b extends close thereto, its collection efficiency of carriers is high as compared with the finger end area C4. In any area of the bus bar end area C3 and the finger end area C4, there is a tendency such that as the position approaches the sides 74, the electricity collection efficiency reduces, and as the position approaches the center, the electricity collection efficiency increases. The areas along the corner portions 76 are also areas having low electricity collection efficiency.

The first metal electrode 20 includes a plurality of finger electrodes 21 extending in parallel to each other, and three bus bar electrodes 22 extending perpendicularly to the finger electrodes 21.

The finger electrodes 21 are distributed over substantially the entire surface of the light-receiving surface 70a to collect the generated electric power efficiently. Among the plurality of finger electrodes 21 provided in parallel with each other, the left end finger electrode 21a is provided near the left side 74a, and the right end finger electrode 21b is provided near the right side 74b. Further, the upper ends 21c of the finger electrodes 21 extending in the y-direction are provided near the upper side 74c, and the lower ends 21d of the finger electrodes 21 are provided near the lower side 74d.

The finger electrodes 21 are the electrodes formed on the light-receiving surface 70a, and thus are desirable to be thinly formed so as not to block light incident on the electricity generation layer 10. For example, the width $w_A$ in the transverse direction of the finger electrode 21 may be about 80 μm.

The bus bar electrodes 22 are provided to extend in the x-direction from the left end finger electrode 21a to the right end finger electrode 21b so as to connect each of the plurality of finger electrodes 21 arranged in parallel. Thus, the left ends 22a of the bus bar electrodes 22 are provided in the vicinity of the left side 74a, and the right ends 22b of the bus bar electrodes 22 are provided in the vicinity of the right side 74b.

The bus bar electrode 22 needs to be thin so as not to block the light incident on the electricity generation layer 10, and in addition, needs to be thick to some extent so as to be able to allow the electric power collected from the plurality of finger electrodes 21 to flow efficiently. For example, a width $w_B$ of the bus bar electrode 22 in the transverse direction may be about 100 μm.

The second metal electrode 30 provided on the back surface 70b, similarly to the first metal electrode 20, includes a plurality of finger electrodes extending parallel to each other and three bus bar electrodes extending perpendicularly to the finger electrodes. Incidentally, since the back surface 70b is not a main surface on which sunlight is mainly incident, the electricity collection efficiency may be enhanced by providing larger number of the finger electrodes on the back surface 70b side than the light-receiving surface 70a side.

The light diffusion portion 60 is provided along the sides 74 and the corner portions 76 so as to cover the entire surface of the outer peripheral area C1 on the light-receiving surface 70a. The light diffusion portion 60 has widths $w_1$ to $w_4$ in the transverse direction perpendicular to the sides 74 or the corner portions 76 which are larger than the width $w_A$ of the finger electrodes 21 or the width $w_B$ of the bus bar electrode 22, so that incident light toward the outer peripheral area C1 is effectively made incident on the inner area C2. For example, the light diffusion portion 60 is provided so that its widths $w_1$ to $w_4$ in the transverse direction are 200 μm or more; however, the widths of the light diffusion portion 60 in the transverse direction are not restricted to this.

The light diffusion portion 60 includes a left side light diffusion portion 60a provided along the left side 74a, and a right side light diffusion portion 60b provided along the right side 74b. Further, the light diffusion portion 60 includes the upper side light diffusion portion 60c provided along the upper side 74c, and the lower side light diffusion portion 60d provided along the lower side 74d.

The left side light diffusion portion 60a and the right side light diffusion portion 60b are formed to have small widths in the transverse direction as compared with the upper side light diffusion portion 60c and the lower side light diffusion portion 60d. This is because the bus bar end area C3 has relatively high electricity collection efficiency in the outer peripheral area C1, and it is desirable to provide the light diffusion portion 60 in areas adjacent to the left side 74a and the right side 74b where the electricity collection efficiency is reduced. The width $w_1$ of the left side light diffusion portion 60a and the width $w_2$ of the right side light diffusion portion 60b may be, for example, between 100 μm and 900 μm inclusive, and preferably, may be about 600 μm.

On the other hand, the upper side light diffusion portion 60c and the lower side light diffusion portion 60d are formed to have large widths in the transverse direction as compared with the left side light diffusion portion 60a and the right side light diffusion portion 60b. This is because the finger end area C4 has relatively low electricity collection efficiency in the outer peripheral area C1, and widening the light diffusion portion 60 for diffusing light to other areas tends to increase the electricity generation efficiency. The width $w_3$ of the upper side light diffusion portion 60c and the width $w_4$ of the lower side light diffusion portion 60d may be, for example, between 300 µm and 3 mm inclusive, and preferably, may be about 1 mm.

Incidentally, the light diffusion portion 60 is also provided in areas along the corner portions 76. The corner portions 76 are also located near the ends of the finger electrodes, and since the electricity collection efficiency is low in the areas, it is possible to enhance the electricity generation efficiency by providing light diffusion portions in the corner portions 76. The width of the light diffusion portion provided at the corner portions 76, for example, may be between 500 µm and 3 mm inclusive, and preferably may be about 1 mm.

Next, an example of the method for manufacturing the solar cell 78 will be described.

The light diffusion portion 60 described above is formed by applying the coating by screen printing. First, a screen printing process according to a comparative example will be described to discuss problems in the comparative example. Subsequently, the screen printing process according to an embodiment will be described focusing on differences from the printing process in the comparative example.

Figure 3:
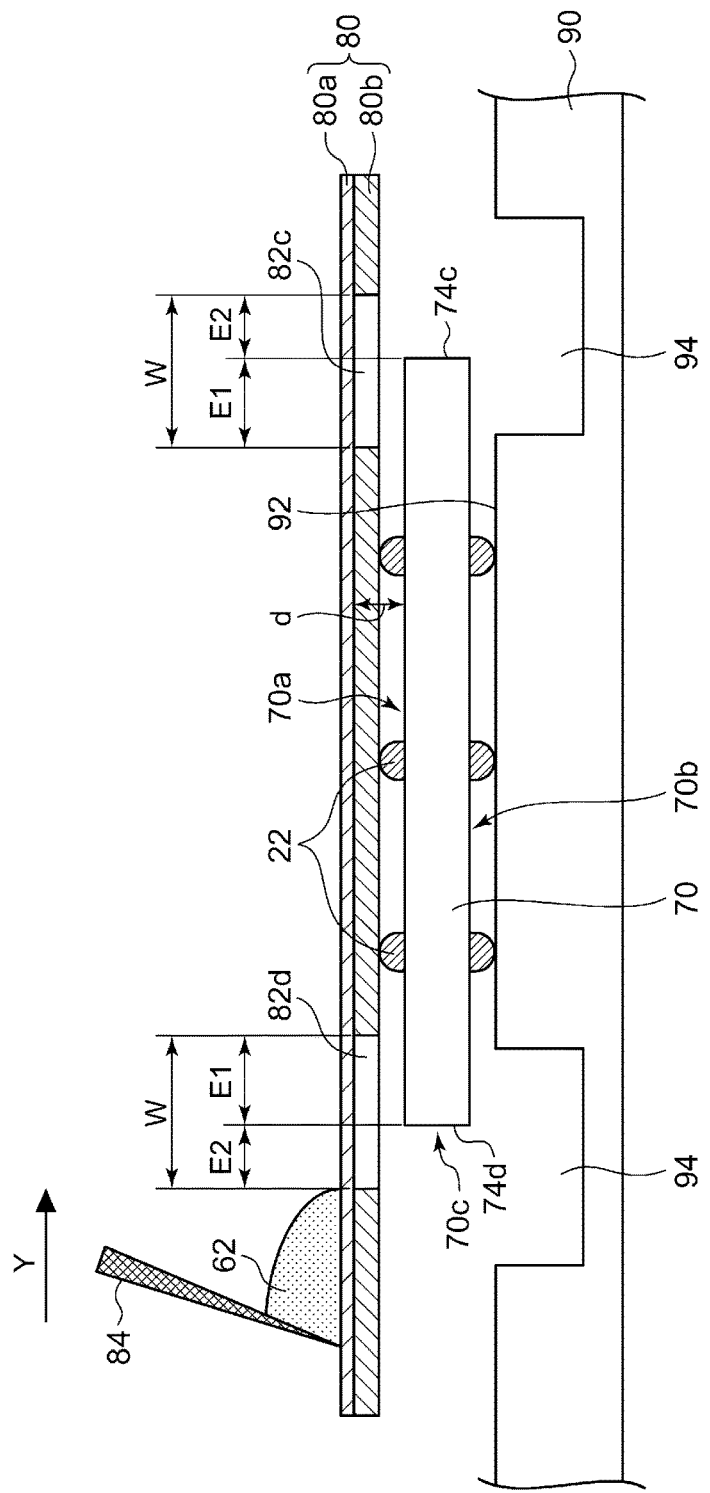
FIG. 3 is a diagram illustrating a screen printing process according to a comparative example.
Figure 4:
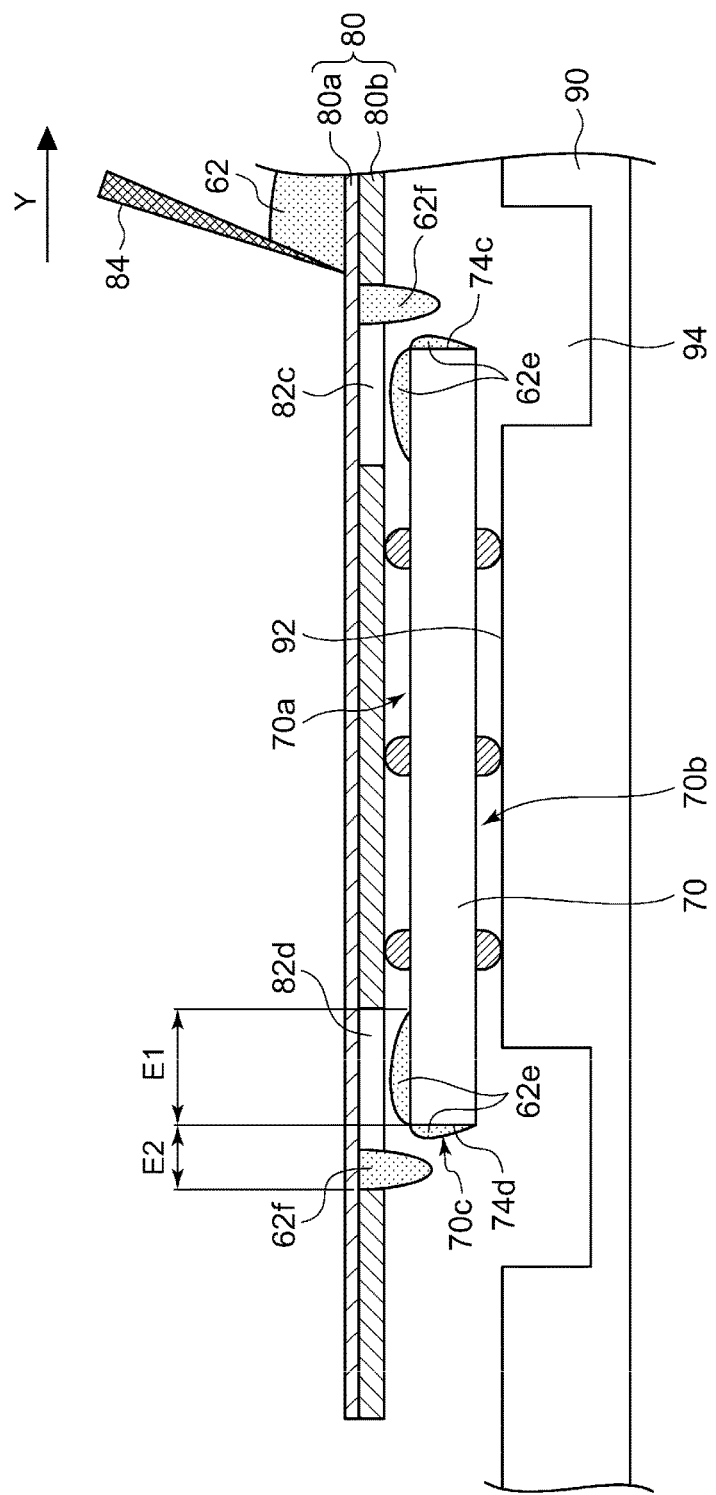
FIG. 4 is a diagram illustrating the screen printing process according to the comparative example.

FIGS. 3 and 4 are diagrams illustrating screen printing processes according to a comparative example. The photoelectric conversion element 70 is disposed on a stage 90 provided with grooves 94. Thereafter, a printing plate 80 having openings 82c and 82d is disposed over the light-receiving surface 70a of the photoelectric conversion element 70, and by moving a squeegee 84 in the Y-direction, the coating 62 is applied to the light-receiving surface 70a via the printing plate 80. The Y-direction in which the squeegee 84 is moved is a direction in which the finger electrodes extend, and the coating 62 is applied from the lower side 74d toward the upper side 74c. Therefore, the lower side 74d is at the print start position, and then the upper side 74c is at the print end position.

The coating 62 is applied by moving the squeegee 84 in the Y-direction in which the finger electrodes extend after the finger electrodes and the bus bar electrodes 22 are formed on the light-receiving surface 70a of the photoelectric conversion element 70. By applying the coating 62 after providing the bus bar electrodes 22, the distance d between the light-receiving surface 70a and a mesh 80a can be secured as compared with the case where there are no bus bar electrodes 22, and it is possible to thicken the coating 62. Further, by printing in the direction in which the finger electrodes extend, damage to the finger electrodes that may occur during printing can be prevented as compared with the case of printing in a direction crossing the finger electrodes.

The printing plate 80 has a metal mesh 80a, an emulsion 80b arranged corresponding to the pattern of the printing plate 80. An area where the emulsion 80b is provided is an area where the coating 62 is not applied, and the areas W where the emulsion 80b is not provided corresponds to the openings 82c and 82d of the printing plate 80. The opening area W is provided so that the outer periphery is larger than an application area E1 on the light-receiving surface 70a, and the opening area W extends over both the application area E1 and an extension area E2 provided so as to surround the outer periphery of the application area E1. By providing the opening even in an area corresponding to the extension area E2, the coating 62 can be applied also to the side surface 70c.

Incidentally, since the photoelectric conversion element 70 is not provided under the extension area E2, a coating 62f extruded by the squeegee 84 tends to accumulate in a position corresponding to the extension area E2. By utilizing this accumulated coating 62f, the coating can be applied on the side surface 70c. However, when the photoelectric conversion element 70 is placed on a flat stage, there is a possibility that the coating 62f is attached to the stage. Then, the coating will bond the stage and the photoelectric conversion element 70 together, and thus at the time of attempting to raise the photoelectric conversion element 70 from the stage, the photoelectric conversion element 70 can be damaged by a stress applied thereto. Therefore, the stage 90 on which the grooves 94 are provided at positions corresponding to the outer periphery of the photoelectric conversion element 70 is used. This prevents the adhesion of the coating 62 to the stage 90.

Figure 5:
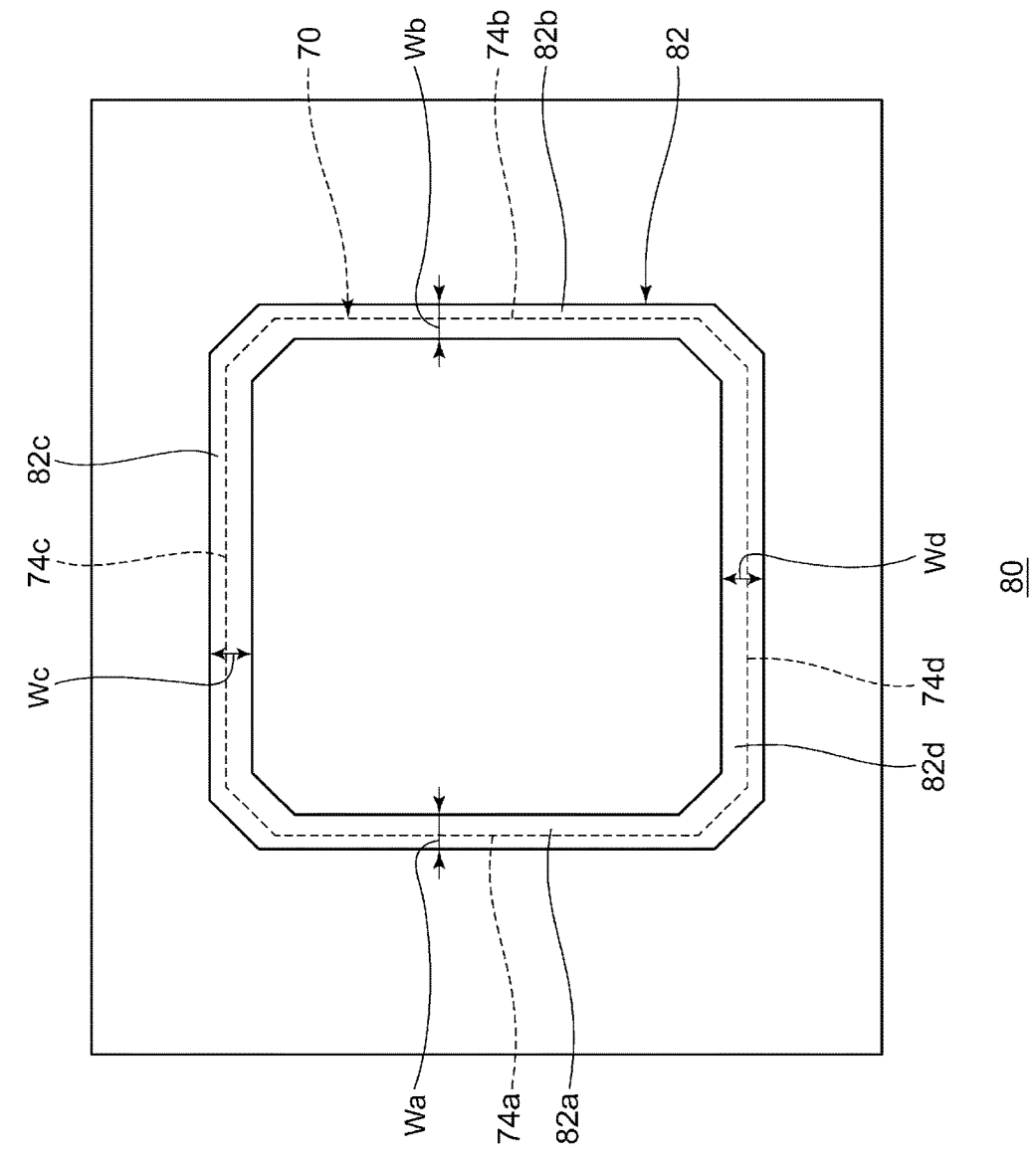
FIG. 5 is a top view of a printing plate to be used for applying the coating to the light diffusion portion according to the comparative example.

FIG. 5 is a top view illustrating the printing plate to be used for applying the coating to the light diffusion portion according to a comparative example. The figure illustrates a position corresponding to the outer periphery of the photoelectric conversion element 70 by broken lines.

The printing plate 80 has the pattern 82 having a frame shape corresponding to the shape of the outer peripheral area C1 of the light-receiving surface 70a. The pattern 82 has openings 82a to 82d in areas corresponding to the four sides 74a to 74d of the photoelectric conversion element 70. As illustrated in the figure, the opening widths Wa and Wb of the openings 82a and 82b corresponding to the left side 74a and the right side 74b are smaller than the opening widths Wc and Wd of the openings 82c and 82d corresponding to the upper side 74c and the lower side 74d. By using the printing plate 80 having the pattern 82 like this, the widths in the transverse direction of the coating 62 applied along the left side 74a and the right side 74b can be made smaller than the widths in the transverse direction of the coating 62 applied along the upper side 74c and the lower side 74d.

In the comparative example, similarly to the embodiment described later, a coating 62e is applied to cover the entire side surface 70c corresponding to the upper side 74c. On the other hand, as for the lower side 74d, unlike the embodiment described later, the coating 62e is applied to cover the entire side surface 70c. The problems in the case of applying the coating in this way will be described below with reference to FIGS. 6A and 6B.

FIG. 6A is a diagram illustrating a state of a print start position of the screen printing process, and FIG. 6B is a diagram illustrating a state of a print end position of the screen printing process. The figures show states in which the printing plate 80 is bent in the z-direction toward the light-receiving surface 70a side by being pressed by the tip portion of the squeegee 84, and angles $\theta_{in}$ and $\theta_{out}$ formed by the printing plate 80 and the light-receiving surface 70a at that time are shown. Also the figure illustrates states before and after moving the squeegee 84 in the vicinity of the lower side 74d or the upper side 74c, and the state before moving is shown by broken lines, and the state after moving is shown by solid lines. Displacements $\Delta Z_{in}$ and $\Delta Z_{out}$ of the printing plate 80 in the z-direction against a movement amount $\Delta Y$ in the y-direction of the squeegee 84 at this time are shown.

As illustrated, the angle $\theta_{in}$ of the printing plate 80 at the print start position is greater than the angle $\theta_{out}$ of the printing plate 80 at the print end position. Therefore, the amount of displacement of the printing plate 80 against the same amount of movement $\Delta Y$ of the squeegee 84 is larger at the print start position than at the print end position ($\Delta Z_{in} > \Delta Z_{out}$). As a result, the speed at which the printing plate 80 moves away from the photoelectric conversion element 70 is larger at the print start position than at the print end position. At the time of printing, the printing plate 80 is temporarily adhered to the light-receiving surface 70a and the side surface 70c by the coating, and thus the photoelectric conversion element 70 receives force in the z-direction in which the printing plate 80 moves away when the printing plate 80 moves away from the photoelectric conversion element 70. At this time, the force applied to the photoelectric conversion element 70 increases as the amount of coating to be applied increases, and the photoelectric conversion element 70 may be damaged. In particular, since the speed at which the printing plate 80 moves away from the photoelectric conversion element 70 is large at the print start position, the photoelectric conversion element 70 is likely to be damaged when the printing plate 80 moves away from photoelectric conversion element 70 and may lead to a reduction in yield.

On the other hand, since the force applied in the z-direction in which the printing plate 80 moves away is small at the print end position where the printing plate 80 moves away slowly from the photoelectric conversion element 70, photoelectric conversion element 70 is less likely to be damaged when the printing plate 80 moves away from the photoelectric conversion element 70. However, when the speed at which the printing plate 80 moves away from the photoelectric conversion element 70 is small, the viscosity of the coating increases and therefore, the coating having adhered temporarily to the light-receiving surface 70a and side surface 70c does not remain as it is, and is likely to be peeled by the printing plate 80. Hence, at the print end position, the coating is not applied with a uniform width, thereby tending to cause a coating failure. As a result, it may lead to a reduction in yield.

Therefore, in the present embodiment, by using different application amounts of the coating between at the lower side 74d corresponding to the start position and at the upper side 74c corresponding to the end position, a reduction in yield of the printing process is prevented. Specifically, the application amount of the coating to be applied along the lower side 74d is reduced and the application amount of the coating to be applied along the upper side 74c is increased. Such printing processes will be described below with reference to FIGS. 7 and 8.

Figure 7:
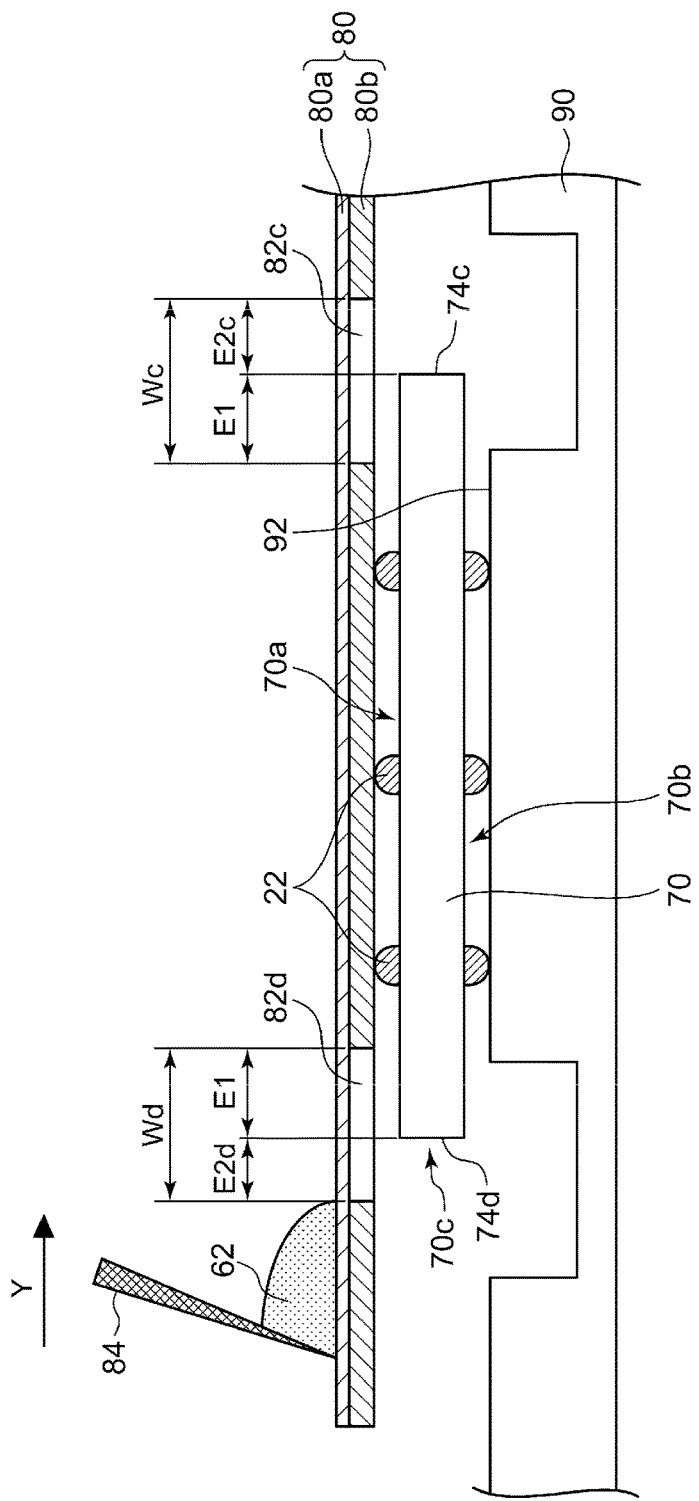
FIG. 7 is a diagram illustrating a screen printing process according to an embodiment.
Figure 8:
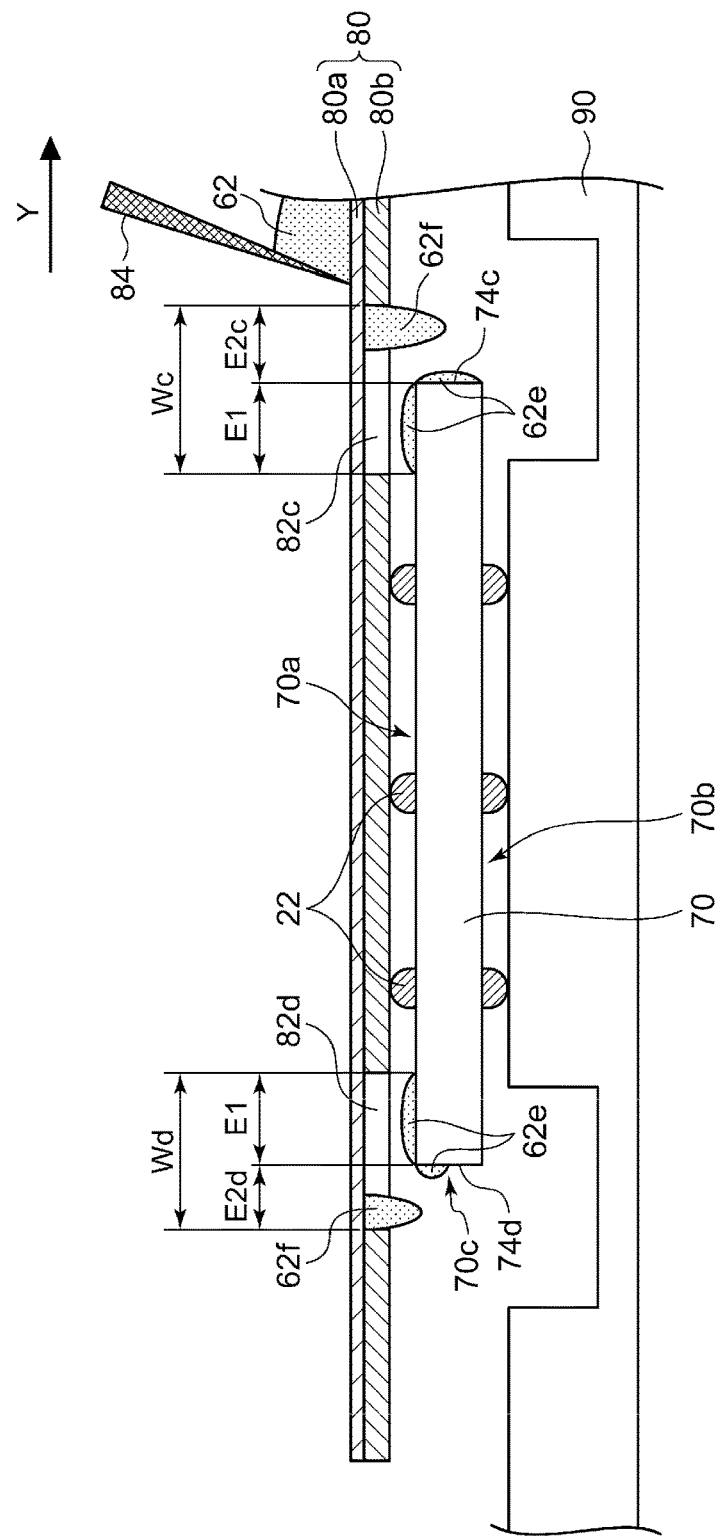
FIG. 8 is a diagram illustrating the screen printing process according to the embodiment.

FIGS. 7 and 8 are diagrams illustrating a screen printing process according to the embodiment. In the comparative example, the widths of the extension areas E2 are the same at portions corresponding to the upper side 74c and the lower side 74d; however, in the embodiment, the widths of extension areas E2c and E2d are different at portions corresponding to the upper side 74c and the lower side 74d. While the width of the extension area E2c corresponding to the upper side 74c is increased so that the amount of the coating to be applied to the upper side 74c is increased, the width of the extension area E2d corresponding to the lower side 74d is decreased so that the amount of the coating to be applied to the lower side 74d is decreased. In other words, the printing plate 80 is configured so that the opening width Wd in the direction perpendicular to the lower side 74d at the portion corresponding to the lower side 74d is smaller than the opening width Wc in the direction perpendicular to the upper side 74c at the portion corresponding to the upper side 74c.

In the lower side 74d, the coating 62e is applied to a partial area of the side surfaces 70c close to the light-receiving surface 70a side by reducing the width of the extension area E2d. By reducing the application width on the side surface 70c in the z-direction in which the printing plate 80 moves away, force applied to the photoelectric conversion element 70 can be reduced when the printing plate 80 moves away from the photoelectric conversion element 70. Thus, a reduction in yield can be prevented by avoiding damage to the photoelectric conversion element 70.

On the other hand, by increasing the width of the extension area E2c on the upper side 74c, a coating 62e is applied to substantially the entire surface of the side surface 70c extending from the light-receiving surface 70a to the back surface 70b. On the upper side 74c, insufficiency of the coating 62e applied to the area along the upper side 74c of the light-receiving surface 70a is prevented by increasing the application amount of the coating 62e so as to cover substantially the entire side surface 70c. Thus, a reduction in yield can be prevented by suppressing the occurrence of application defects.

Thereafter, the light diffusion portion 60 is formed by curing a coating 62e applied by screen printing.

The following describes effects achieved by the solar cell 78 according to the present embodiment.

In the present embodiment, reduced is the application amount of the coating to be applied to the lower side 74d which is at a print start position, and increased is the application amount of the coating to be applied to the upper side 74c which is at the print end position. By reducing the application amount of the coating at the print start position, it is possible to reduce the force applied to the photoelectric conversion element 70 when the printing plate moves away at the print start position where the speed of printing plate 80 moving away from the photoelectric conversion element 70 is high. On the other hand, by increasing the application amount of the coating at the print end position, it is possible to prevent the occurrence of coating defects due to insufficient coating at the print end position where the coating does not tend to adhere well to the photoelectric conversion element 70 because the speed at which the printing plate 80 moves away from the photoelectric conversion element 70 is slow. This can suppress damage and application failures to the photoelectric conversion element 70 and thereby, a reduction in the manufacturing yield of the solar cell 78 can be prevented.

Further, in the present embodiment, the upper side 74c and the lower side 74d where the application width of the coating 62 is increased can be set to be at the print start and the print end positions by applying the coating 62 in the direction in which the finger electrodes extend. If the position of the left side 74a or the right side 74b having a narrow application width of the coating 62 were at the print start position or the print end position, it would be difficult to apply the coating 62 with a uniform width since the coating width is narrow. Further, if the left side 74a or the right side 74b were set to be at the print start position or the print end position, the printing would be conducted in a direction crossing the finger electrodes and thereby it might peel the finger electrodes to cause damage in the application step of the coating 62. In the present embodiment, since the upper side 74c or the lower side 74d having a large application width is set to be at the print start position or the print end position, application defects can be prevented when applying the coating 62.

Further, in the present embodiment, the widths of the left side light diffusion portion 60a and the right side light diffusion portion 60b in the transverse direction are small, and the widths of the upper side light diffusion portion 60c and the lower side light diffusion portion 60d in the transverse direction are large. By providing the wide light diffusion portion 60 to the finger end area C4 having lower electricity collection efficiency, light incident on the finger end area C4 can be effectively utilized. Further, also in the bus bar end area C3 where the electricity collection efficiency is relatively high, by providing the narrow light diffusion portion 60, the light incident on the vicinity of the left side 74a or the right side 74b can be effectively utilized. This can enhance the electricity generation efficiency of the solar cell 78.

Further, in the present embodiment, by providing the light diffusion portion 60 in the outer peripheral area C1 of the light-receiving surface 70a and the side surface 70c, the outer peripheral end of the solar cell 78 can be protected. Further, by providing the light diffusion portion 60 along the four sides 74, the solar cell 78 can have a strong structure against the force applied in the bending direction of the light-receiving surface 70a of the solar cell 78. Moreover, since the light diffusion portion 60 is provided around the corner 70d of the solar cell 78, a strong structure against an impact applied to the corner 70d can be secured by protecting the corner 70d.

Further, in the present embodiment, since the widths of the light diffusion portions 60 provided on the side surface 70c are different between at the upper side 74c and at the lower side 74d, the upper side 74c and the lower side 74d can be distinguished by appearance. Even if the finger electrodes, the bus bar electrode and the shape of the light diffusion portion 60 provided on the light-receiving surface 70a are prepared so as to be vertically symmetrical, there are cases where the shapes may not be vertically symmetrical due to the positioning accuracy and the like during the manufacturing. The solar cells 78 can be modularized by connecting a plurality of the solar cells 78 to each other; however, when the solar cells 78 are not vertically symmetrical, it becomes necessary to modularize while distinguishing the upper side 74c and the lower side 74d. Otherwise, the connecting position of the tab wire for connecting a plurality of solar cells 78 to each other may be shifted or the plurality of solar cells 78 are connected to be misaligned, and thereby production problems are caused. In the present embodiment, since the upper side 74c and the lower side 74d can be distinguished by appearance, the solar cells 78 can be easily modularized while aligning in the vertical direction as well as identifying the vertical direction. Thus, the labor involved in identifying the top and bottom is reduced, and the efficiency of the modularization process can be increased.

One aspect is as follows. The method for manufacturing the solar cell 78 according to an aspect, including:

preparing the photoelectric conversion element 70 having the surface (light-receiving surface 70a) whose outer periphery is surrounded by the plurality of sides 74, and the coating 62 having light diffusivity; and applying the coating 62 by screen printing to the outer peripheral area C1 of the surface in the direction from the lower side 74d that is one of the plurality of sides 74 to the upper side 74c that is one of the plurality of sides 74 and that is opposed to the lower side 74d such that the application amount of the coating 62 to be applied along the lower side 74d is smaller than the application amount of the coating 62 to be applied along the upper side 74c.

The photoelectric conversion element 70 may have the side surface 70c provided between the surface (light-receiving surface 70a) and the back surface 70b arranged to be opposed to the surface (light-receiving surface 70a), and in the method for manufacturing the solar cell 78, the coating 62 may be applied on the side surface 70c so that the width $h_4$ in the direction from the surface (light-receiving surface 70a) toward the back surface 70b of the coating 62 applied on the side surface 70c corresponding to the lower side 74d is made smaller than the width $h_3$ in the direction from the surface (light-receiving surface 70a) toward the back surface 70b of the coating 62 applied on the side surface 70c corresponding to the upper side 74c.

In the method for manufacturing the solar cell 78, the coating 62 may be applied to the outer peripheral area C1 by using the printing plate 80 having a pattern 82 corresponding to the outer peripheral area C1, the width Wd of the pattern 82 in the direction perpendicular to the lower side 74d at a portion corresponding to the lower side 74d is smaller than the width Wc of the pattern 82 in the direction perpendicular to the upper side 74c at a portion corresponding to the upper side 74c.

The photoelectric conversion element 70 may have, on the surface (light-receiving surface 70a), the plurality of finger electrodes 21 which are parallel to each other and which extend in a direction from the lower side 74d toward the upper side 74c and the bus bar electrode 22 extending to intersect the plurality of finger electrodes 21, the surface (light-receiving surface 70a) may have the left side 74a which is one of the plurality of sides 74 and in which is parallel to the finger electrodes 21, and the right side 74b which is one of the plurality of sides 74 and which is opposed to the left side 74a and parallel to the finger electrodes 21, in the method for manufacturing the solar cell 78, the coating 62 may be applied to the outer peripheral area C1 of the surface (light-receiving surface 70a) such that the width ($w_1$ or $w_2$) in the transverse direction perpendicular to the left side 74a or the right side 74b, of the coating 62 applied to the surface (light-receiving surface 70a) along the left side 74a and the right side 74b is smaller than the width ($w_3$ or $w_4$) in the transverse direction perpendicular to the upper side 74c or the lower side 74d, of the coating 62 applied to the surface (light-receiving surface 70a) along the upper side 74c and the lower side 74d.

Another aspect is the solar cell 78. This solar cell 78 includes:

the photoelectric conversion element 70 having the surface (light-receiving surface 70a) whose outer periphery is surrounded by the plurality of sides 74, and the side surface 70c provided between the surface (light-receiving surface 70a) and the back surface 70b arranged to be opposed to the surface (light-receiving surface 70a); and the light diffusion portion 60 provided in the outer peripheral area C1 of the surface (light-receiving surface 70a) and the side surface 70c, and the light diffusion portion 60 includes the lower sidelight diffusion portion 60d provided along the lower side 74d which is one of the plurality of sides 74 and the upper side light diffusion portion 60c provided along the upper side 74c which is one of the plurality of sides 74 and opposed to the lower side 74d, and the width $h_4$ of the lower side light diffusion portion 60d on the side surface 70c in the direction from the surface (light-receiving surface 70a) to the back surface 70b is smaller than the width $h_3$ of the upper side light diffusion portion 60c on the side surface 70c in the direction from the surface (light-receiving surface 70a) to the back surface 70b.

The solar cell 78 may have the plurality of finger electrodes 21 extending in parallel to one another from the lower side 74d toward the upper side 74c and the bus bar electrode 22 extending to intersect the plurality of finger electrodes 21, on the surface (light-receiving surface 70a), and the surface (light-receiving surface 70a) may have the left side 74a which is one of the plurality of sides 74 and extending in parallel to the finger electrodes 21 and the right side 74b which is one of the plurality of sides 74, is opposed to the left side 74a and extends in parallel to the finger electrode 21, and the light diffusion portion 60 may have the left side light diffusion portion 60a provided along the left side 74a, and the right side light diffusion portion 60b provided along the right side 74b, and the width ($w_1$ or $w_2$) of the left side light diffusion portion 60a or the right side light diffusion portion 60b in the transverse direction perpendicular to the left side 74a or the right side 74b may be smaller than the width ($w_3$ or $w_4$) of the upper side light diffusion portion 60c or the lower side light diffusion portion 60d in the transverse direction perpendicular to the upper side 74c or the lower side 74d.

(Modification 1)

Figure 9:
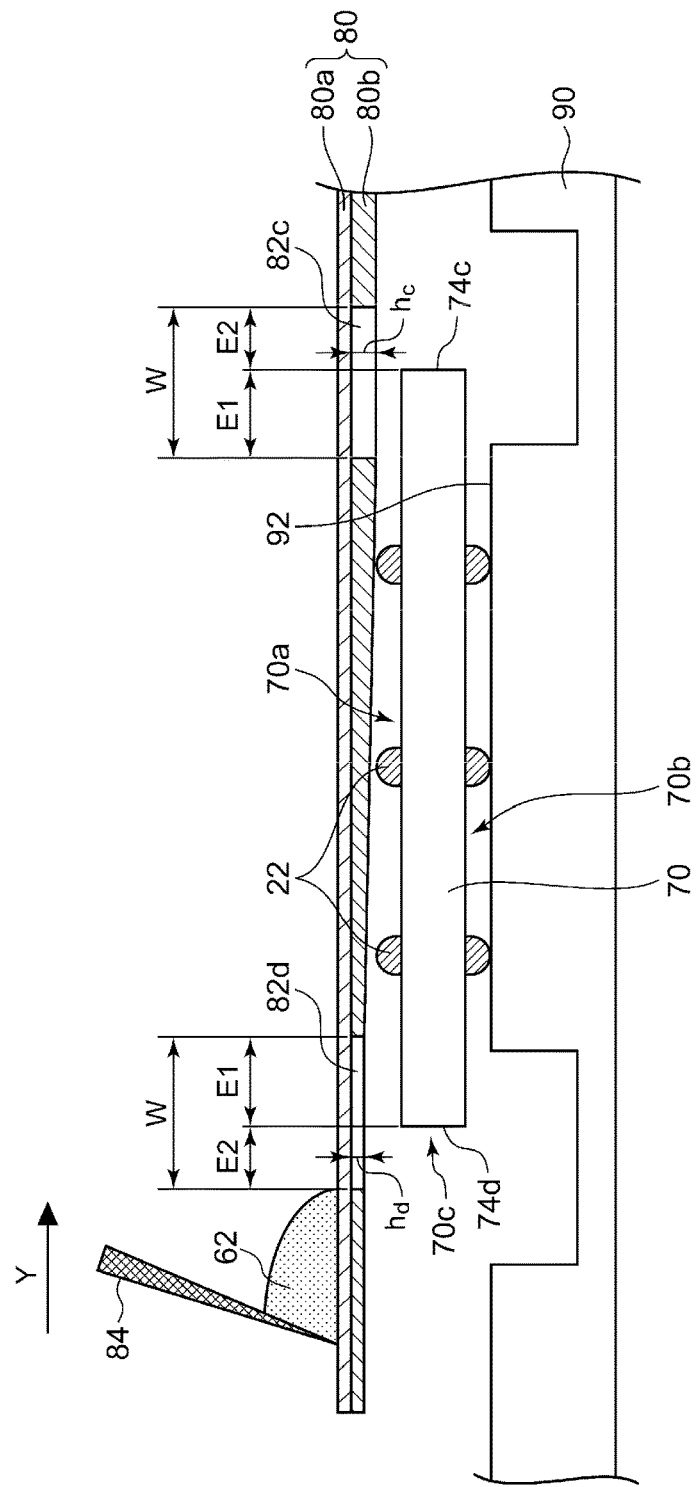
FIG. 9 is a diagram illustrating a screen printing process according to a modification.

FIG. 9 is a diagram illustrating a screen printing process according to a modification. In the above embodiment, by changing the opening width Wc and Wd of the printing plate 80, the application amount of the coating is set to be different between at the upper side 74c and at the lower side 74d. In Modification 1, by changing thicknesses $h_c$ and $h_d$ of the emulsion 80b constituting the openings 82c and 82d, the application amount of the coating is changed. More specifically, by increasing the thickness $h_d$ of the emulsion 80b at the opening 82c corresponding to the upper side 74c, the application amount of the coating 62 is increased. On the other hand, the thickness $h_d$ of the emulsion 80b is reduced at the opening 82d corresponding to the lower side 74d to reduce the application amount of the coating 62. Thus, the light diffusion portion 60 similar to the embodiment described above can be formed.

In the manufacturing method of the solar cell 78, the coating 62 may be applied to the outer peripheral area C1 by using the printing plate 80 in which a pattern is formed by providing the emulsion 80b on the surface of the mesh 80a and in which the thickness $h_d$ of the emulsion 80b at a portion corresponding to the lower side 74d is smaller than the thickness $h_e$ of the emulsion 80b at a portion corresponding to the upper side 74c.

(Modification 2)

In the embodiment and Modification 1 described above, by changing the shape of the openings 82c and 82d of the printing plate 80, the application amount of the coating at the upper side 74c and the lower side 74d is changed. In Modification 2, a difference is made in the amount of the coating by changing the speed or pressure of the printing without changing the pattern of the printing plate 80. More specifically, by using the printing plate 80 as shown in FIG. 3, and in addition, by increasing the printing speed, the application amount is reduced at the print start position, and by reducing the printing speed, the application amount is increased at the print end position. Other than this, the application amount may be reduced by reducing the printing pressure at the print start position and may be increased by increasing the printing pressure at the print end position. By such methods, the light diffusion portion 60 similar to the embodiment described above can be formed.

In the method for manufacturing the solar cell 78, the coating 62 may be applied to the outer peripheral area C1 such that the printing pressure when applying the coating 62 along the lower side 74d is lower than the printing pressure when applying the coating 62 along the upper side 74c.

In the manufacturing method of the solar cell 78, the coating 62 may be applied to the outer peripheral area C1 such that the printing speed in the direction from the lower side 74d to the upper side 74c when applying the coating 62 along the lower side 74d is higher than the printing speed when applying the coating 62 along the upper side 74c.

(Second Embodiment)

Figure 10:
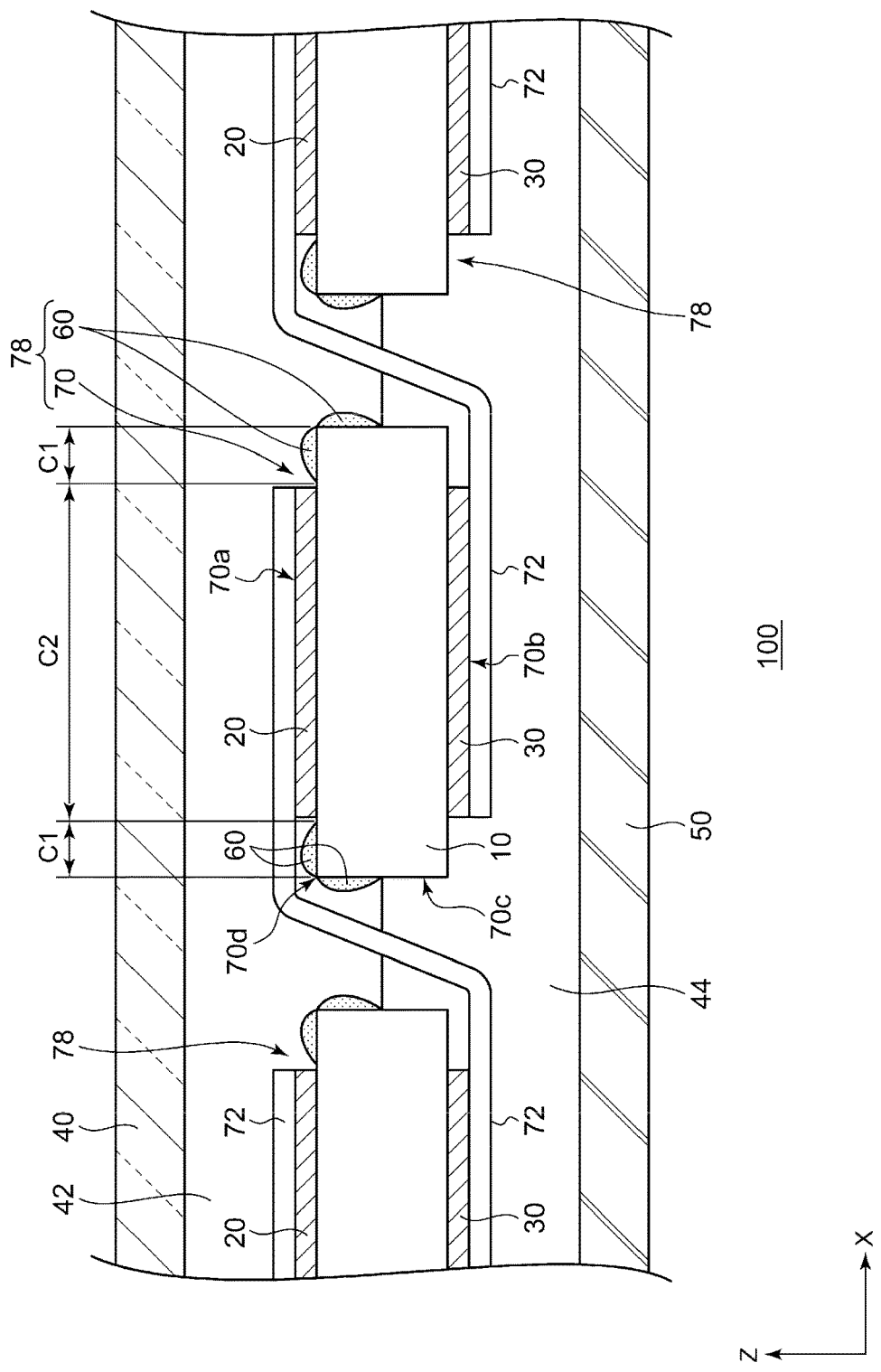
FIG. 10 is a cross-sectional view illustrating a structure of a solar cell module according to an embodiment.

FIG. 10 is a cross-sectional view illustrating a structure of the solar cell module 100 according to the embodiment.

The solar cell module 100 according to the present embodiment includes the plurality of solar cells 78 and the tab wiring 72 for connecting the adjacent solar cells 78 to each other. Further, the solar cell module 100 includes a protective substrate 40, a back sheet 50, a first encapsulant 42, and a second encapsulant 44. Incidentally, each of the solar cells 78 has the same configuration as the solar cell 78 according to the first embodiment described above.

The tab wiring 72 is an elongated metal foil, and copper foil coated with silver or aluminum foil is used for example. One end of the tab wiring 72 is connected to the first metal electrode 20 of the solar cell 78, and the other end is connected to the second metal electrode 30 of another solar cell 78 to be interconnected. Incidentally, the tab wiring 72 is disposed in the direction (x-direction) in which the bus bar electrode to be described later extends and is connected to the bus bar electrodes forming the first metal electrode 20 and the bus bar electrode forming the second metal electrode 30.

The protective substrate 40 and the back sheet 50 protect the solar cell 78 from the external environment. The protective substrate 40 provided on the light-receiving surface 70a side allows light in a wavelength band which the solar cell 78 absorbs for generating electricity to pass through. The protective substrate 40 is, for example, a glass substrate. The back sheet 50 is a resin substrate of polyethylene terephthalate (PET) or polyimide, or the same glass substrate as the protective substrate 40.

The first encapsulant 42 and the second encapsulant 44 are formed of a resin material such as EVA or polyimide. Thus, the penetration of moisture or the like into the electricity generation layer of the solar cell module 100 can be prevented, and in addition, the strength of the entire solar cell module 100 is improved. A white resin material obtained by dispersing particles such as titania may be used for the second encapsulant 44 on the back surface 70b side. Thereby, light having reached the second encapsulant 44 after passing through the solar cells 78 can be scattered to be directed to the solar cell 78 again.

Next, an example of the method for manufacturing the solar cell module 100.

First, the photoelectric conversion element 70 is prepared to form the light diffusion portion 60 on the photoelectric conversion element 70. The light diffusion portion 60 can be formed through the processes shown in the first embodiment or modifications described above. After the solar cell 78 on which the light diffusion portion 60 is formed is connected by the tab wiring 72, the first encapsulant 42 and the protective substrate 40 are disposed on the light-receiving surface 70a side, and the second encapsulant 44 and the back sheet 50 are disposed on the back surface 70b. Then, the solar cell 78 sandwiched between the protective substrate 40 and the back sheet 50 is subjected to thermal compression bonding. Thereby, the solar cell module 100 shown in FIG.

10 in which the first encapsulant 42 and the second encapsulant 44 are fused is formed.

The following describes effects which is achieved by the solar cell module 100 according to the present embodiment.

In the present embodiment, since the light diffusion portion 60 is provided so as to cover the entire surface of the outer peripheral area C1 of the light-receiving surface 70a, the sealing properties of the solar cell module 100 can be enhanced. This is because the light diffusion portion 60 has a higher adhesion to the first encapsulant 42 than the transparent electrode layer exposed on the light-receiving surface 70a of the photoelectric conversion element 70. Further, since the upper side light diffusion portion 60c and the lower side light diffusion portion 60d are wider than the left side light diffusion portion 60a and the right side light diffusion portion 60b, the adhesion strength in the x-direction along the upper side 74c and the lower side 74d is increased. The tab wiring 72 extends in the x-direction, and thus an x-direction stress tends to be applied to the solar cell module 100 by the connection of the tab wiring 72. In the present embodiment, since the adhesion strength in the x-direction can be increased by the wide upper side light diffusion portion 60c and the wide lower side light diffusion portion 60d, the reliability of the solar cell module 100 can be improved.

Incidentally, the solar cell module 100 according to the present embodiment can also achieve the same effect as the solar cell 78 according to the first embodiment described above.

Although the present invention has been described with reference to the above-described embodiments, the present invention is not intended to be limited to the above embodiments, and appropriate combinations and replacements of configurations of the embodiments are also intended to be included in the present invention. It is also possible to rearrange appropriately a combination or the order of processing in each embodiment based on the knowledge of a person skilled in the art or to add modifications of various design changes and the like to the respective embodiments, and embodiments to which such modifications are added also can be included in the scope of the present invention.

In the photoelectric conversion element 70 shown in the embodiment described above, it is assumed that a p-type amorphous layer is provided on the light-receiving surface 70a side of the semiconductor substrate, and an n-type amorphous layer is provided on the back surface 70b side; however, a photoelectric conversion element having the conductivity types disposed oppositely may also be used. Further, the semiconductor substrate may be a p-type single-crystal silicon substrate.

In the embodiments and modifications described above, as a method for changing the application amount of the coating on the upper side 74c and the lower side 74d, a method of changing the opening width or the thickness of the emulsion of the printing plate 80, and a method of changing the pressure or the speed of the printing are shown. As further modifications, it is also possible to adjust the application amount of the coating to be applied to the upper side 74c and the lower side 74d by combining these methods.

In the above embodiment, regarding the width in the transverse direction of the light diffusion portion 60 provided on the four sides 74a to 74d and the corner portions 76, the preferred values and the preferred magnitude relationship at each of the sides 74a to 74d or corner portions 76 have been indicated. In further modifications, the width in the transverse direction of the light diffusion portion 60 provided on the four sides 74a to 74d and the corner portions 76 may be different from the values or magnitude relationship shown in the above embodiments. For example, the widths in the transverse direction of the light diffusion portion 60 provided on the respective sides 74a to 74d and the corner portions 76 may be uniform, or the widths of the light diffusion portion 60 at the left side 74a and the right side 74b may be larger than the widths of the light diffusion portion 60 at the upper side 74c and the lower side 74d. Other than these, the light diffusion portion 60 may be provided only to the upper side 74c and the lower side 74d, and may not be provided to the left side 74a, the right side 74b or the corner portions 76. Further, the light diffusion portion 60 may be provided only to the upper side 74c, the lower side 74d and the corner portions 76.

It should be understood that the invention is not limited to the above-described embodiment, but may be modified into various forms on the basis of the spirit of the invention. Additionally, the modifications are included in the scope of the invention.

What is claimed is:

1. A solar cell comprising:
   a photoelectric conversion element including:
      a light incident surface and a back surface opposed to the light incident surface; and
      a side surface provided between the light incident surface and the back surface,
      wherein the photoelectric conversion element has a plurality of sides; and
   a light diffusion portion on an outer peripheral area of the light incident surface and the side surface,
   the light diffusion portion having:
      a lower side light diffusion portion in direct contact with the outer peripheral area of the light incident surface and the side surface on a lower side that is one of the plurality of sides; and
      an upper side light diffusion portion in direct contact with the outer peripheral area of the light incident surface and the side surface on an upper side that is one of the plurality of sides and opposed to the lower side,
   wherein a width of the lower side light diffusion portion on the side surface in a direction from the light incident surface toward the back surface is smaller than a width of the upper side light diffusion portion on the side surface in the direction from the light incident surface toward the back surface,
   wherein a first corner portion constituted by a part of the light incident surface and a part of the side surface is exposed from the light diffusion portion, and
   wherein the first corner portion is located along the lower side or the upper side.

2. The solar cell according to claim 1, comprising:
   a plurality of finger electrodes extending in parallel to each other in a direction from the lower side toward the upper side on the light incident surface; and
   a bus bar electrode extending to intersect the plurality of finger electrodes, on the light incident surface, wherein:
   the photoelectric conversion element includes:
      a left side that is one of the plurality of sides and parallel to the plurality of finger electrodes; and
      a right side that is one of the plurality of sides, opposed to the left side, and parallel to the plurality of finger electrodes, the light diffusion portion includes:
- a left side light diffusion portion in direct contact with the outer peripheral area of the light incident surface and the side surface on the left side; and
- a right side light diffusion portion in direct contact with the outer peripheral area of the light incident surface and the side surface on the right side, and widths of the left side light diffusion portion and the right side light diffusion portion in a transverse direction perpendicular to the left side or the right side are smaller than widths of the upper side light diffusion portion and the lower side light diffusion portion in a transverse direction perpendicular to the upper side or the lower side.

3. The solar cell according to claim 1, further comprising a first electrode including:
- a plurality of finger electrodes extending in parallel to each other in a direction from the lower side toward the upper side on the light incident surface; and
- a bus bar electrode extending to intersect the plurality of finger electrodes, on the light incident surface,
- wherein a thickness, measured along a normal direction of the light incident surface, of the light diffusion portion on the light incident surface is thinner than a thickness, measured along the normal direction, of the first electrode.

4. The solar cell according to claim 1, further comprising a first electrode including:
- a plurality of finger electrodes extending in parallel to each other in a direction from the lower side toward the upper side on the light incident surface; and
- a bus bar electrode extending to intersect the plurality of finger electrodes, on the light incident surface,
- wherein a conductivity of the light diffusion portion is lower than a conductivity of the first electrode.

5. The solar cell according to claim 1, wherein a part of the side surface is exposed from the light diffusion portion.

6. The solar cell according to claim 1, wherein a second corner portion constituted by a part of the back surface and a part of the side surface is exposed from the light diffusion portion.

7. The solar cell according to claim 1, wherein the light diffusion portion includes an epoxy resin or an acrylic resin.

8. The solar cell according to claim 1, wherein the light diffusion portion is made from white colored material.

9. The solar cell according to claim 8, wherein the white colored material contains resin, and contains particles of titania having light diffusion function.

10. The solar cell according to claim 8, wherein the white colored material contains resin, and contains particles of alumina having light diffusion function.

11. A solar cell module comprising:
the solar cell according to claim 1;
a first encapsulant provided on the light incident surface of the solar cell; and
a second encapsulant provided on the back surface of the solar cell.

12. The solar cell module according to claim 11, wherein the second encapsulant contains resin, and further contains particles of titania having light diffusion function.

13. The solar cell module according to claim 11, wherein the first and second encapsulants are disposed on the light diffusion portion and the first encapsulant is in direct contact with the first corner portion that is exposed from the light diffusion portion.

14. The solar cell module according to claim 11, wherein the second encapsulant is in direct contact with a part of the side surface.

15. A solar cell comprising:
a photoelectric conversion element including:
- a light incident surface and a back surface opposed to the light incident surface; and
- a side surface provided between the light incident surface and the back surface,
- wherein the photoelectric conversion element has a plurality of sides; and a light diffusion portion on an outer peripheral area of the light incident surface and the side surface,
the light diffusion portion having:
- a lower side light diffusion portion in direct contact with the outer peripheral area of the light incident surface and the side surface on a lower side that is one of the plurality of sides; and
- an upper side light diffusion portion in direct contact with the outer peripheral area of the light incident surface and the side surface on an upper side that is one of the plurality of sides and opposed to the lower side, wherein a first corner portion constituted by a part of the light incident surface and a part of the side surface is exposed from the light diffusion portion,
wherein the first corner portion is located along the lower side or the upper side.

16. The solar cell of claim 15, wherein a second corner portion constituted by a part of the back surface and a part of the side surface is exposed from the light diffusion portion.

17. The solar cell of claim 15, wherein a maximum width of the lower side light diffusion portion on the side surface in a direction from the light incident surface toward the back surface is smaller than a maximum width of the upper side light diffusion portion on the side surface in the direction from the light incident surface toward the back surface.

* * * * *